US012785039B2

(12) United States Patent
Solmaz et al.

(10) Patent No.: US 12,785,039 B2
(45) Date of Patent: Nov. 3, 2026

(54) METHOD AND SYSTEM FOR PLASMA PROCESS

(71) Applicant: Tokyo Electron Limited, Tokyo (JP)

(72) Inventors: Evrim Solmaz, Austin, TX (US); Du Zhang, Albany, NY (US); Barton Lane, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 456 days.

(21) Appl. No.: 18/489,416

(22) Filed: Oct. 18, 2023

(65) Prior Publication Data

US 2025/0132128 A1 Apr. 24, 2025

(51) Int. Cl.
*H01J 37/32* (2006.01)

(52) U.S. Cl.
CPC .. *H01J 37/32155* (2013.01); *H01J 37/32449* (2013.01); *H01J 37/32091* (2013.01); *H01J 2237/3174* (2013.01)

(58) Field of Classification Search
CPC combination set(s) only.
See application file for complete search history.

(56) References Cited

U.S. PATENT DOCUMENTS

| | | | |
|---|---|---|---|
| 4,754,163 A | 6/1988 | Aue et al. | |
| 5,304,282 A | 4/1994 | Flamm | |
| 5,928,528 A | 7/1999 | Kubota et al. | |
| 8,735,291 B2 | 5/2014 | Ranjan et al. | |
| 8,962,488 B2 * | 2/2015 | Liao | C23F 1/00 216/68 |
| 9,159,575 B2 | 10/2015 | Ranjan et al. | |
| 9,257,294 B2 | 2/2016 | Rueger | |
| 9,514,967 B2 | 12/2016 | Ohgoshi et al. | |
| 9,570,313 B2 | 2/2017 | Ranjan et al. | |
| 9,583,357 B1 | 2/2017 | Long et al. | |
| 9,726,621 B1 | 8/2017 | Bahr | |
| 9,831,064 B2 | 11/2017 | Konno et al. | |
| 9,870,898 B2 | 1/2018 | Urakawa et al. | |
| 10,304,660 B1 | 5/2019 | Shoeb et al. | |
| 10,325,758 B2 * | 6/2019 | Yamawaku | H01J 37/3211 |
| 10,755,895 B2 | 8/2020 | Marakhtanov et al. | |

(Continued)

FOREIGN PATENT DOCUMENTS

| | | |
|---|---|---|
| CN | 1363721 A | 8/2002 |
| CN | 1619011 A | 5/2005 |

(Continued)

OTHER PUBLICATIONS

International Searching Authority, "Notification of Transmittal of The International Search Report and The Written Opinion of The International Searching Authority, or The Declaration," Date of mailing Dec. 3, 2024, International application No. PCT/US2024/042785, 9 pages.

(Continued)

*Primary Examiner* — Cachet I Proctor
(74) *Attorney, Agent, or Firm* — Slater Matsil, LLP

(57) ABSTRACT

A method for a plasma process includes generating plasma within a process chamber with a source power pulse and applying a bias power pulse to a substrate holder within the process chamber. A frequency of the bias power pulse increases from a first frequency value to a second frequency value during the bias power pulse. The bias power pulse occurs after the source power pulse.

23 Claims, 9 Drawing Sheets

(56) References Cited

U.S. PATENT DOCUMENTS

| | | | | |
|---|---|---|---|---|
| 2001/0051438 | A1 | 12/2001 | Shin et al. | |
| 2002/0115301 | A1 | 8/2002 | Savas | |
| 2002/0160125 | A1 | 10/2002 | Johnson et al. | |
| 2003/0070759 | A1 | 4/2003 | Aota et al. | |
| 2005/0090118 | A1 | 4/2005 | Shannon | |
| 2005/0103623 | A1 | 5/2005 | Tolmachev et al. | |
| 2006/0121704 | A1 | 6/2006 | Walther et al. | |
| 2008/0317965 | A1 | 12/2008 | Son et al. | |
| 2009/0207537 | A1 | 8/2009 | Coumou | |
| 2009/0255800 | A1 | 10/2009 | Koshimizu | |
| 2009/0294062 | A1 | 12/2009 | Shannon et al. | |
| 2010/0130018 | A1 | 5/2010 | Tokashiki et al. | |
| 2010/0243607 | A1 | 9/2010 | Ohse et al. | |
| 2010/0248488 | A1 | 9/2010 | Agarwal et al. | |
| 2010/0273332 | A1 | 10/2010 | Edelberg | |
| 2010/0315064 | A1 | 12/2010 | Kuthi et al. | |
| 2011/0139748 | A1 | 6/2011 | Donnelly et al. | |
| 2011/0143537 | A1 | 6/2011 | Lee et al. | |
| 2013/0059448 | A1 | 3/2013 | Marakhtanov et al. | |
| 2013/0105443 | A1 | 5/2013 | Banna et al. | |
| 2013/0222055 | A1 | 8/2013 | Coumou et al. | |
| 2014/0118031 | A1 | 5/2014 | Rughoonundon et al. | |
| 2014/0216922 | A1 | 8/2014 | Ritchie | |
| 2014/0262755 | A1 | 9/2014 | Deshmukh et al. | |
| 2014/0273487 | A1* | 9/2014 | Deshmukh ........ | H01J 37/32091 156/345.43 |
| 2015/0076112 | A1 | 3/2015 | Sriraman et al. | |
| 2017/0098527 | A1 | 4/2017 | Kawasaki et al. | |
| 2017/0099722 | A1* | 4/2017 | Kawasaki ......... | H01J 37/32146 |
| 2017/0103873 | A1 | 4/2017 | Kawasaki | |
| 2017/0186586 | A1 | 6/2017 | Oh et al. | |
| 2017/0229312 | A1 | 8/2017 | Park et al. | |
| 2017/0365445 | A1 | 12/2017 | Kubota | |
| 2020/0058469 | A1 | 2/2020 | Ranjan et al. | |
| 2021/0242309 | A1 | 8/2021 | Hsieh | |
| 2021/0249225 | A1* | 8/2021 | Ranjan .............. | H01J 37/32082 |
| 2021/0320012 | A1* | 10/2021 | Shimizu ............ | H01J 37/32183 |
| 2021/0398777 | A1 | 12/2021 | Shiina et al. | |
| 2023/0377853 | A1 | 11/2023 | Chen et al. | |
| 2023/0411116 | A1 | 12/2023 | Chen et al. | |

FOREIGN PATENT DOCUMENTS

| | | | |
|---|---|---|---|
| CN | 1983351 | A | 6/2007 |
| CN | 101843178 | A | 9/2010 |
| CN | 102024658 | A | 4/2011 |
| CN | 103903949 | A | 7/2014 |
| CN | 103915308 | A | 7/2014 |
| CN | 104465291 | A | 3/2015 |
| CN | 104465296 | A | 3/2015 |
| CN | 104733278 | A | 6/2015 |
| CN | 106449396 | A | 2/2017 |
| CN | 106920734 | A | 7/2017 |
| CN | 107039263 | A | 8/2017 |
| JP | 199608045903 | A | 2/1996 |
| JP | 2001322534 | A | 11/2001 |
| JP | 2001358129 | A | 12/2001 |
| JP | 2016511551 | A | 4/2016 |
| JP | 2017069542 | A | 4/2017 |
| KR | 20120027159 | A | 3/2012 |
| KR | 101703366 | B1 | 2/2017 |
| KR | 20180051741 | A | 5/2018 |
| KR | 20200134070 | A | 12/2020 |
| TW | 201108871 | A | 3/2011 |
| TW | 1374271 | B | 10/2012 |
| TW | 201533797 | A | 9/2015 |
| TW | 201643956 | A | 12/2016 |
| TW | 1584700 | B | 5/2017 |
| TW | 201722213 | A | 6/2017 |
| TW | 201724920 | A | 7/2017 |
| TW | 1604498 | B | 11/2017 |
| TW | 201810419 | A | 3/2018 |
| WO | 2014159144 | A1 | 10/2014 |
| WO | 2023019145 | A1 | 2/2023 |

OTHER PUBLICATIONS

Carter, G. et al., "Chapter 3: Secondary Electron Emission," Ion Bombardment of Solids, Jun. 1, 1968, 19 pages, American Elsevier Publishing Company, Inc., New York, United States of America.

Keller, J., "Inductive plasmas for plasma processing," Plasma Sources Sci. Technol. 5 (1996) 166-172, IOP Publishing Ltd, in final form Feb. 8, 1996, 7 pages.

Keller, J., "New and possible future trends in inductively coupled plasmas (ICPs) for semiconductor processing," Plasma Phys. Control. Fusion 39 (1997) A437-A443, IOP Publishing Ltd, May 1997, 7 pages.

Niazi, K. et al., "Operation of a helical resonator plasma source," Plasma Sources Sci. Technol. 3 (1994) 482-495, IOP Publishing Ltd, in final form Feb. 17, 1994, 15 pages.

Tokashiki, K. et al., "Synchronous Pulse Plasma Operation upon Source and Bias Radio Frequencys for Inductively Coupled Plasma for Highly Reliable Gate Etching Technology," Japanese Journal of Applied Physics 48 (2009) 08HD01, Aug. 20, 2009, 11 pages.

PCT International Search Report and Written Opinion, International Application No. PCT/US2019/045756, dated Nov. 27, 2019, 11 pages.

Piejak, R. et al., "A simple analysis of an inductive RF discharge," Plasma Sources Sci. Technol. 1 (1992) 179-186, IOP Publishing, in final form Jul. 17, 1992, 8 pages.

Banna, S. et al. "Inductively Coupled Pulsed Plasmas in the Presence of Synchronous Pulsed Substrate Bias for Robust, Reliable, and Fine Conductor Etching," IEEE Transactions on Plasma Science, vol. 37, No. 9, Sep. 2009, 17 pages.

* cited by examiner

METHOD AND SYSTEM FOR PLASMA PROCESS

TECHNICAL FIELD

The present invention relates generally to plasma processing, and, in particular embodiments, to plasma processing methods, apparatuses, and systems using changing bias pulse RF frequencies.

BACKGROUND

Device formation within microelectronic workpieces can involve a series of manufacturing techniques including formation, patterning, and removal of a number of layers of material on a substrate. In order to achieve the physical and electrical specifications of current and next generation semiconductor devices, processing flows enabling reduction of feature size while maintaining structural integrity is desirable for various patterning processes. As device structures densify and develop vertically, the desire for precision material processing becomes more compelling.

Plasma processes are commonly used to form devices, interconnects, and contacts in microelectronic workpieces. For example, plasma etching and plasma deposition are common process steps during semiconductor device fabrication. A combination of source power (SP) applied to a coupling element and bias power (BP) applied to a substrate holder can be used to generate and direct plasma. Various conditions during a plasma process may influence whether material is being deposited onto a substrate, etched from the substrate, or a combination of the two.

However, conventional plasma processes fail to independently control etching and deposition during plasma processes resulting in reduced control and precision of the processes. For example, in the specific example of etching processes, some deposition can be useful to protect features that are not the target of the etch. But because conventional plasma processes lack independent and precise control over both deposition and etching, these features are insufficiently protected. Thus, material is undesirably removed from the features causing imperfections in feature profile such as recesses in the tops of features and necking, among others. Therefore, plasma processing methods that enable independent control over deposition and etching may be desirable.

SUMMARY

In accordance with an embodiment, a method for a plasma process includes: generating plasma within a process chamber with a source power (SP) pulse; and applying a bias power (BP) pulse to a substrate holder within the process chamber, a frequency of the BP pulse increasing from a first frequency value to a second frequency value during the BP pulse, the BP pulse occurring after the SP pulse.

In accordance with another embodiment, a method for a plasma process includes: starting a pulsed plasma process with a source power pulse and a bias power pulse, the bias power pulse having a first bias RF frequency, the pulsed plasma process generating a plasma; measuring a peak-to-peak voltage of the plasma; based on the peak-to-peak voltage, determining a first amount to increase bias RF frequency in order to maintain an ion energy peak at a same level; and increasing the first bias RF frequency by the first amount to a second bias RF frequency.

In accordance with yet another embodiment, a method for processing a substrate includes: providing a substrate onto a substrate holder in a process chamber, a first fin extending from the substrate; and forming a passivation layer over the first fin with an ion-assisted deposition, the ion-assisted deposition including: generating low-energy ions at the first fin by generating plasma in the process chamber with a source power (SP) pulse; applying a bias power (BP) pulse to the substrate holder, a frequency of the BP pulse being at a first frequency value; and while applying the BP pulse, increasing the frequency of the BP pulse to a second frequency value.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
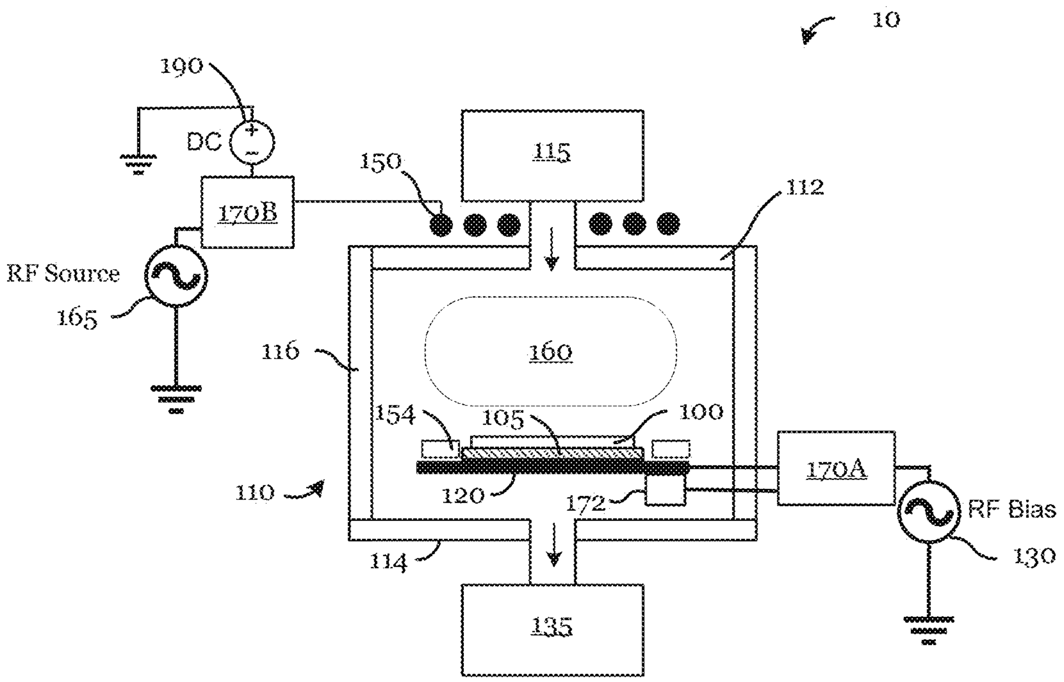
FIG. 1 illustrates an example plasma processing system, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Both source power (SP) and bias power (BP) may be supplied as radio frequency (RF) power to the processing chamber of a plasma processing apparatus. Pulsed plasma processing methods supply one or both of the RF source power and RF bias power to a processing chamber as pulses rather than as continuous wave power. For example, BP pulses may be provided synchronously or asynchronously with SP pulses. Such existing synchronous/asynchronous schemes often use a single RF frequency for the bias power, even when supplying the bias power asynchronously (e.g., single frequency, dual-phase), and may not be adequate to independently control etching and deposition.

Some conventional methods mix RF frequencies to shape the waveform of the BP pulses, but such methods are employed to influence plasma uniformity and do not afford independent control over deposition and etching.

Other conventional methods supply BP pulses with high RF frequency and high power along with the SP pulses and low RF frequency, low power BP pulses with very short duration in between SP pulses to avoid plasma generation and heating. However, the high RF frequency BP pulses may not allow fine control over deposition while the source power is due to generation of high-energy ions with significant verticality. Meanwhile, the low RF frequency BP pulses are intended to reduce any disruption to the plasma structure and therefore may lack the flexibility necessary for full control over etching.

In various embodiments, plasma processing methods described herein apply BP pulses with changing frequency within pulse periods in order to control ion energy distributions within plasma process chambers (e.g., plasma etch reactors). Precise control of ion energy distribution (IED) is advantageous for selectivity control in important etch applications. For example, self-aligned contact (SAC) etches may benefit from ion energy being below a nitride threshold energy $E_{th}(SiNC_xF_y)$ that is above an oxide threshold energy $E_{th}(SiO_2C_xF_y)$ in order to maintain oxide/nitride selectivity for silicon dioxide ($SiO_2$) atomic layer etching (ALE) over silicon nitride (SiN). Additionally, controlling ion energy may be advantageous for addressing sheet loss and recession in polysilicon etch processes. Sheet losses including bowing and/or necking of polysilicon sheets, footing at the bases of sheets, and formation of undesirable fin recesses (e.g., in isolation regions between sheets) may occur during etch processes. Lower ion energy may result in ion-assisted deposition on the tops of sheets, thereby leading to passivation to protect the sheets. As such, controlling the ion energy is advantageous to establish a difference between ion-assisted deposition and etching. For example, it may be useful to maintain the ion energy peaks $E_{high}$ of the ion energy distribution (IED) at a desired low value throughout a pulse period.

In RF-pulsed operations, such as cases with a pulse having a source active phase and an afterglow phase, any types of bias pulses with constant bias frequency may result in the ion energy peak(s) of the ion energy distributions evolving. This may occur during pulse cycles due to decaying ion flux in afterglow phases. As a result, maximum ion energy peaks may exceed the threshold energies of materials not to be etched, compromising selectivity. Compensating for this effect by, for example, lowering bias power may result in power deposition loss. This can cause a decrease in ion flux, which may negatively affect etch throughput.

Enhanced ion energy distribution (IED) is achieved by keeping the ion energy peaks $E_{high}$ of the IED at (or roughly at) a desired energy level throughout a pulse. This may enable etch selectivity control by keeping the ion energy peaks $E_{high}$ below the threshold energy $E_{th,non\text{-}etch}$ of the layer(s) not to be etched throughout the pulse cycle. This can be accomplished by a method of slowly increasing bias RF frequency (also referred to as continuously changing or ramping the bias RF frequency) from a low value to a high value within pulses. Peak-to-peak voltage $V_{pp}$ measurements may be used to determine a frequency which can keep $E_{high}$ at a constant (or roughly constant) energy level. By measuring the peak-to-peak voltage $V_{pp}$. the bias frequency ramp up may be tailored so that the high energy peak $E_{high}$ is kept at the same desired location throughout the source afterglow period.

Unlike conventional methods, this bias pulsing with ramping up of frequency may advantageously facilitate independent control over deposition and etching during a plasma process. For example, passivating species may be deposited with precision using lower-frequency RF bias power ramped up to higher frequency RF bias power. This may be performed prior to an etch phase that uses higher-frequency RF bias power. Tuning of the bias RF frequency ramp up may afford the ability to optimize deposition to within 2-3 atoms (e.g. approaching monolayer) variation, for example. In this way, separate etching and deposition phases may be advantageously realized in one pulsing scheme.

As such, disclosed embodiments including BP pulses with changing frequency within pulse periods may have the advantage of allowing features to be adequately protected during etching phases of the plasma process. The RF bias power pulses with ramped up frequency may be applied after source power pulses with higher frequency to generate low-energy ions at a substrate. The low-energy ions may have the benefit of being substantially thermal, which allows the selective deposition of passivating species at top surfaces of features through ion-assisted deposition mechanisms.

For example, in the specific application of a soft-landing step for gate etching a FinFET device, a highly anisotropic etch profile may be achieved without significant damage to the fin. This may be particularly beneficial since device performance is strongly dependent on fin shape (e.g., the amount of fin recess). With the plasma processing methods described herein, fin recess may be advantageously reduced (e.g., by 45%) over conventional continuous wave or single frequency processes.

Embodiments of the disclosure are described in the context of the accompanying drawings. An embodiment of an example plasma processing system will be described using FIG. 1. One period of a plasma process will be described using FIG. 2. Embodiments of a plasma process with evolving ion energy distributions will be described using FIGS. 3A, 3B, 3C, 3D, and 3E. Embodiments of a plasma process with a source power pulse and a bias power pulse will be described using FIG. 4. Embodiments of an example plasma processing method with a deposition phase and an etching phase will be described using FIGS. 5A and 5B. Embodiments of source/bias pulse schemes for single pulse periods of plasma processing methods will be described using FIGS. 6A, 6B, 6C, and 6D. Embodiments of methods for plasma processes will be described using FIGS. 7 and 8. An embodiment of a method for processing a substrate will be described using FIG. 9.

FIG. 1 illustrates an example plasma processing system 10, in accordance with various embodiments. As illustrated in FIG. 1, the plasma processing system 10 comprises a plasma processing chamber 110 with source power excitation and substrate bias power (in other words, wafer biasing capabilities). A substrate 100 may be placed on a substrate holder 105. In various embodiments, the substrate 100 may be a part of, or including, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

In various embodiments, the plasma processing system 10 may further comprise a focus ring 154 positioned over the bottom electrode 120 to surround the substrate 100. The focus ring 154 may advantageously maintain and extend the uniformity of a plasma 160 to achieve process consistency at the edge of the substrate 100. In various embodiments, the focus ring 154 may have a width of a few cm. In various embodiments, there may be a gap for mechanical clearance between the circumference of the substrate 100 and the focus ring 154. In certain embodiments, the gap may be hundreds of microns to a few mm. In various embodiments, the focus ring 154 may comprise a dielectric material with a desired dielectric constant. In certain embodiments, the focus ring 154 may comprise silicon. Some examples of silicon-based focus ring may comprise silicon, silicon oxide, doped silicon (e.g., boron-doped, nitrogen-doped, and phosphorous-doped), or silicon carbide. Alternatively, in some embodiments, the focus ring may comprise a carbon-based material. In one or more embodiments, the focus ring 154 may comprise a metal oxide, such as aluminum oxide and zirconium oxide.

A process gas may be introduced into the plasma processing chamber 110 by a gas delivery system 115. The gas delivery system 115 may comprise multiple gas flow controllers to control the flow of multiple gases into the plasma processing chamber 110. Any precursors that can create a plasma may be used, such as argon (Ar), tetrafluoromethane ($CF_4$), oxygen ($O_2$), an admixture of tetrafluoromethane and oxygen ($CF_4/O_2$), hexafluorobutadiene ($C_4F_6$), octafluorocyclobutane ($C_4F_8$), nitrogen ($N_2$), hydrogen ($H_2$), hydrogen bromide (HBr), the like, or any combination, or admixture thereof in any suitable ratio. In some embodiments, optional center/edge splitters may be used to independently adjust the gas flow rates at the center and edge of the substrate 100. In various embodiments, the total flow rate of the gas is in a range of 1 standard cubic centimeters per minute (sccm) to 5000 sccm, at a pressure in a range of 0.1 mTorr to 1 Torr, and/or at a temperature in a range of −200° C. to 500° C.

Further, in one embodiment, the gas delivery system 115 may have a special showerhead configuration positioned at the top of the plasma processing chamber 110. For example, the gas delivery system 115 may have a showerhead configuration, covering the entirety of the substrate 100, including a plurality of appropriately spaced gas inlets. Alternatively, gas may be introduced through dedicated gas inlets of any other suitable configuration. The plasma processing chamber 110 may further be equipped with one or more sensors such as pressure monitors, gas flow monitors, and/or gas species density monitors. The sensors may be integrated as a part of the gas delivery system 115 in various embodiments.

In FIG. 1, the plasma processing chamber 110 is a vacuum chamber and may be evacuated using one or more vacuum pumps 135, such as a single stage pumping system or a multistage pumping system (e.g. a mechanical roughing pump combined with one or more turbomolecular pumps). In order to promote even gas flow during plasma processing, gas may be removed from more than one gas outlet or location in the plasma processing chamber 110 (e.g., on opposite sides of the substrate 100).

In various embodiments, the substrate holder 105 may be integrated with, or a part of, a chuck (e.g., a circular electrostatic chuck (ESC)) positioned near the bottom of the plasma processing chamber 110, and connected to a bottom electrode 120. The surface of the chuck or the substrate holder 105 may be coated with a conductive material (e.g., a carbon-based or metal-nitride based coating). The substrate 100 may be optionally maintained at a desired temperature using a temperature sensor and a heating element connected to a temperature controller (not shown). In certain embodiments, the temperature sensor may comprise a thermocouple, a resistance temperature detector (RTD), a thermistor, or a semiconductor based integrated circuit. The heating element may for example comprise a resistive heater in one embodiment. In addition, there may be a cooling element such as a liquid cooling system coupled to the temperature controller. The bottom electrode 120 may be coupled to a RF bias power source 130, such as through or controlled by a controller 170A.

In some embodiments, a voltage probe 172 is coupled to the substrate holder or is otherwise present inside the plasma processing chamber 110. The voltage probe 172 may be used to measure the peak-to-peak voltage $V_{pp}$ of an ion energy distribution of the plasma 160. This may be advantageous for adjusting the RF bias power frequency to achieve a stable peak energy of the ion energy distribution. The voltage probe 172 may be coupled to the controller 170A (or to another suitable controller or computer) to provide measurements of the peak-to-peak voltage $V_{pp}$ to the controller 170A. The measured peak-to-peak voltage $V_{pp}$ will be used to look up the relationship between the ion energy distribution, the RF bias power frequency, and the peak-to-peak voltage $V_{pp}$ from previously computed data. This relationship will be used to determine by how much to increase RF bias power frequency in order to maintain a constant peak energy of the ion energy distribution, as described below with respect to FIGS. 3B-3E.

Further in FIG. 1, a top electrode 150 may be a conductive helical coil electrode located outside the plasma processing chamber 110, positioned above a top plate 112. The top electrode 150 may be coupled to RF power source 165 via a controller 170B. The top plate 112, a bottom plate 114, and a side wall 116 may be conductive and electrically connected to the system ground (a reference potential).

In some embodiments, the controller 170A and the controller 170B are coupled together or are part of a single controller, such as a programmable processor, microprocessor, computer, or the like. Although the controllers 170A and 170B is illustrated as two element for illustrative purposes, the controllers 170A and 170B may include additional elements or be part of a single element. The controllers 170A and 170B may be programmable by instructions stored in software, firmware, hardware, or a combination thereof. The controllers 170A and 170B may be configured to set, monitor, and/or control various control parameters associated with generating a plasma and delivering ions to the surface of a microelectronic workpiece. Control parameters may include, but are not limited to, power level, frequency, and duty cycle (%) for both the source power and the bias power as well as delay time between source power pulse and bias power pulse. Other control parameter sets may also be used.

In some embodiments, the operating pulse frequency range for the RF source power is 1 Hz to 1 MHz. While only one RF power source is illustrated in FIG. 1, more than one RF power source(s) may be used in various embodiments, for example, to provide a low frequency RF power and a high frequency RF power at the same time. The plasma 160 may be generated and sustained by pulsed RF power.

In various embodiments, a RF pulsing at a kHz range may be used to power the plasma 160. Using the RF pulsing may help generating high energetic ions (>keV) in the plasma 160 for the plasma etch process, while reducing a charging effect.

In some embodiments, the operating frequency range for the RF bias power is 100 kHz to 10 GHz. While only one bias RF power source is illustrated in FIG. 1, more than one bias RF power source(s) may be used in various embodiments, for example, to provide a low frequency bias RF power and a high frequency bias RF power at the same time and enable changing the bias RF frequency more rapidly.

The configurations of the plasma etching system described above is for example only. In alternative embodiments, various alternative configurations may be used for a plasma processing system that incorporates a set of electromagnets. For example, the plasma processing system may be a resonator such as a helical resonator that produces helicons. Further, microwave plasma (MW), electron cyclotron resonance (ECR), capacitively coupled plasma (CCP), multi-frequency CCP, inductively coupled plasma (ICP), or other suitable systems may be used. In various embodiments, the RF power, chamber pressure, substrate temperature, gas flow rates and other plasma process parameters may be selected in accordance with the respective process recipe.

In addition, embodiments of the present invention may be also applied to remote plasma systems as well as batch systems. For example, the substrate holder may be able to support a plurality of wafers that are spun around a central axis as they pass through different plasma zones. Accordingly, it is possible to have multiple plasma zones, for example, including a metal-containing plasma zone, metal-free plasma zone, and plasma-free zone (e.g., a purge zone).

Figure 2:
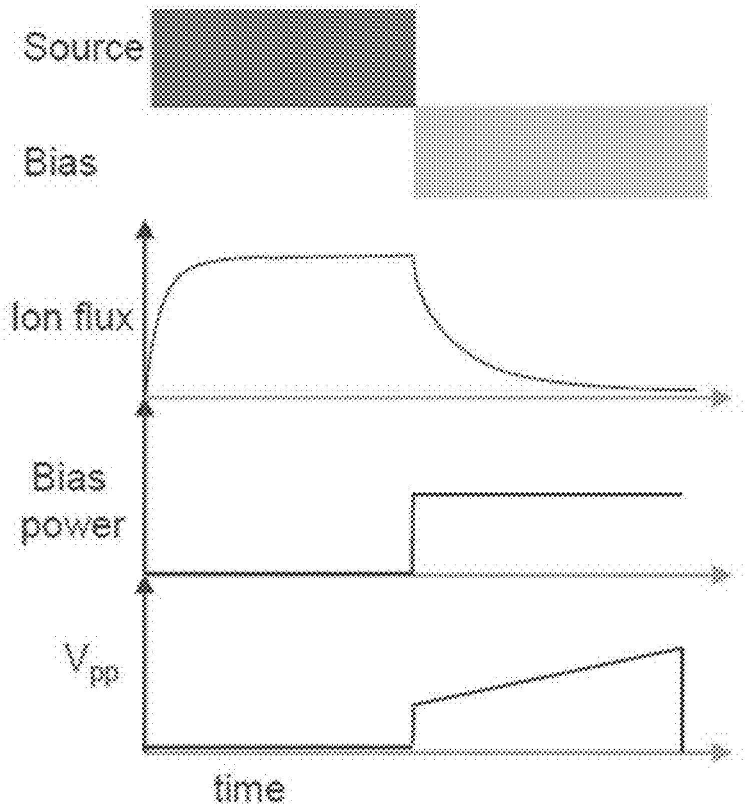
FIG. 2 illustrates graphs for one pulse period of a plasma process, in accordance with some embodiments.

FIG. 2 illustrates graphs of source power pulse, bias power pulse, ion flux, bias power, and peak-to-peak voltage $V_{pp}$ versus time for one period of a plasma process, in accordance with some embodiments. The plasma process may be performed in a plasma processing system such as the example plasma processing system 10 described above with respect to FIG. 1. As shown in FIG. 2, the period of the plasma process (e.g., an etch process) includes a source phase with a source power pulse and a bias phase with a bias power pulse. The bias power pulse follows the source power pulse and the source power pulse and bias power pulse do not overlap. The bias phase, when the bias power pulse is active and the source power pulse is inactive, is also referred to as the afterglow phase or afterglow.

During the source phase when the source power pulse is active, an ion energy distribution is generated in a plasma (e.g., the plasma 160) and the ion flux $\Gamma_i$ in the plasma increases to a plateau value. The ion flux $\Gamma_i$ may be useful for generating low-energy ions at a substrate that are substantially thermal, allowing for the selective deposition of passivating species at top surfaces of features through ion-assisted deposition mechanisms.

However, during the bias phase when the bias power pulse becomes active and the source power pulse is inactive, the ion flux $\Gamma_i$ may fall off asymptotically while a peak-to-peak voltage $V_{pp}$ of the ion energy distribution rises. It may be advantageous to counter the fall off of the ion flux $\Gamma_i$ while maintaining a peak energy $E_{high}$ of the ion energy distribution at roughly the same level in order to, for example, more efficiently deposit passivating species at top surfaces of features during the second phase. This can be achieved by ramping up the RF frequency of the bias power pulses during each bias power pulse.

Controlling ion energy distribution may be very important for etch processes. Precise control of peak ion energy may be crucial for selectivity, such as in self-aligned contact (SAC) etching and polysilicon etching (e.g., in order to form and/or remove dummy gates). However, for etch processes including multiple ions, selectivity may suffer if the ion energy varies. As such, it is desirable to have an ion energy peak of the ion energy distribution remain at the same (or roughly the same) energy level.

As described above with respect to FIG. 2, ion flux $\Gamma_i$ may decrease and peak-to-peak voltage $V_{pp}$ may increase during the afterglow phase after a source pulse ends. The location of the one or more energy peak(s) of the ion energy distribution may evolve from lower to higher energies with the decrease in ion flux $\Gamma_i$. It is desirable to maintain the ion energy peak $E_{high}$ at a same energy level for process control. This can be achieved by increasing the frequency of the bias pulse (e.g., the capacitively coupled plasma (CCP) bias frequency or equivalent in other plasma systems) to compensate for the ion flux $\Gamma_i$ and ion density loss as the afterglow phase progresses. Increasing the frequency of the bias pulse during the performance of the bias pulse may provide electron heating to compensate for ion flux $\Gamma_i$ decrease and maintain the ion energy peak $E_{high}$ at the same energy level.

Figure 3A:
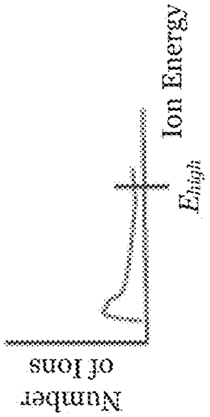
FIGS. 3A, 3B, 3C, 3D, and 3E illustrate graphs of ion energy distributions during a plasma process, in accordance with some embodiments.

FIG. 3A illustrates a graph of an ion energy distribution during a source power pulse of a plasma process and FIGS. 3B, 3C, 3D, and 3E illustrate graphs of the ion energy distribution in the subsequent afterglow phase of the plasma process while the frequency of a bias power pulse is ramped up, in accordance with some embodiments. FIGS. 3A-3E plot the number of ions at each energy versus the ion energies of the ion energy distribution. In FIG. 3A during the source power pulse, the ion energy distribution peaks at a lower value because the plasma is being energized by the source power pulse.

Figure 3B:
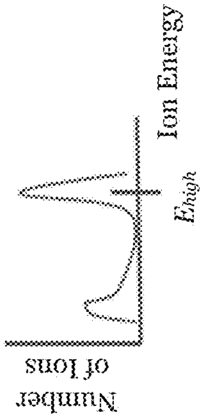
Figure 3C:
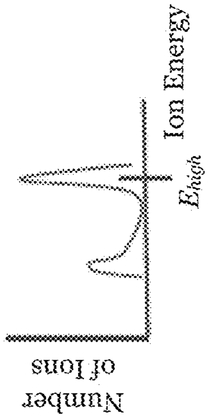
Figure 3D:
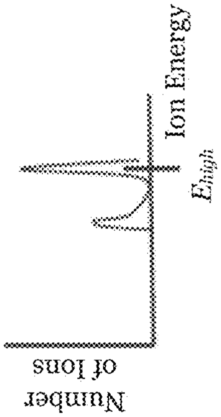
Figure 3E:
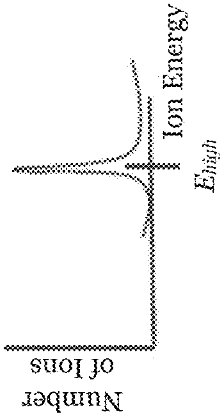

FIG. 3B illustrates the start of the bias power pulse at a lower frequency (e.g., in a range of 200 kHz to 600 kHz, such as 400 kHz). In FIG. 3B, the ion energy distribution peaks at a desired energy $E_{high}$ that may be advantageous for deposition of passivating species on semiconductor features. In some embodiments, the desired energy $E_{high}$ is in a range of 10 eV to 300 eV. Next, in FIGS. 3C-3E, the frequency of the bias power pulse is increased while the bias power pulse is active in order to maintain the peak of the ion energy distribution peaks at the desired energy $E_{high}$, up to a higher frequency in FIG. 3E (e.g., in a range of 20 MHz to 100 MHz, such as 60 MHz). As the ion flux $\Gamma_i$ decreases during the afterglow phase, the peak-to-peak voltage $V_{pp}$ increases at constant power. However, when the bias RF frequency is increased at the same time, the two energy peaks of the ion energy distribution (see FIGS. 3B-3D) may coalesce at the higher energy level of $E_{high}$ (see FIG. 3E). This may compensate for the tendency of the peak of the ion energy distribution to shift to the right (e.g., to higher energies) and maintain the peak at a lower energy $E_{high}$ suitable for deposition of passivating species.

In some embodiments, measurements of the peak-to-peak voltage $V_{pp}$ (such as from a voltage probe 172; see above, FIG. 1) are taken during the afterglow phase and are used to determine how to ramp up the bias RF frequency. For example, the voltage probe 172 may provide peak-to-peak voltage $V_{pp}$ measurements to a controller (e.g., the controller 170A; see above, FIG. 1), which looks up the relationship between peak-to-peak voltage $V_{pp}$ and bias RF frequency for ion energy distributions. The relationship between peak-to-peak voltage $V_{pp}$ and bias RF frequency may be stored in a memory of the controller. The controller 170A then determines by how much to increase the bias RF frequency to keep $E_{high}$ constant and proceeds to ramp up the bias RF frequency by the determined amount and at the determined rate. The process may be cyclical so that the controller repeats the steps of measuring the peak-to-peak voltage $V_{pp}$, looking up the relationship between peak-to-peak voltage $V_{pp}$ and bias RF frequency, determining the amount to increase the bias RF frequency to keep $E_{high}$ constant, and increasing the bias RF frequency by the determined amount for any suitable number of cycles, such as 1 to 10000 cycles.

Figure 4:
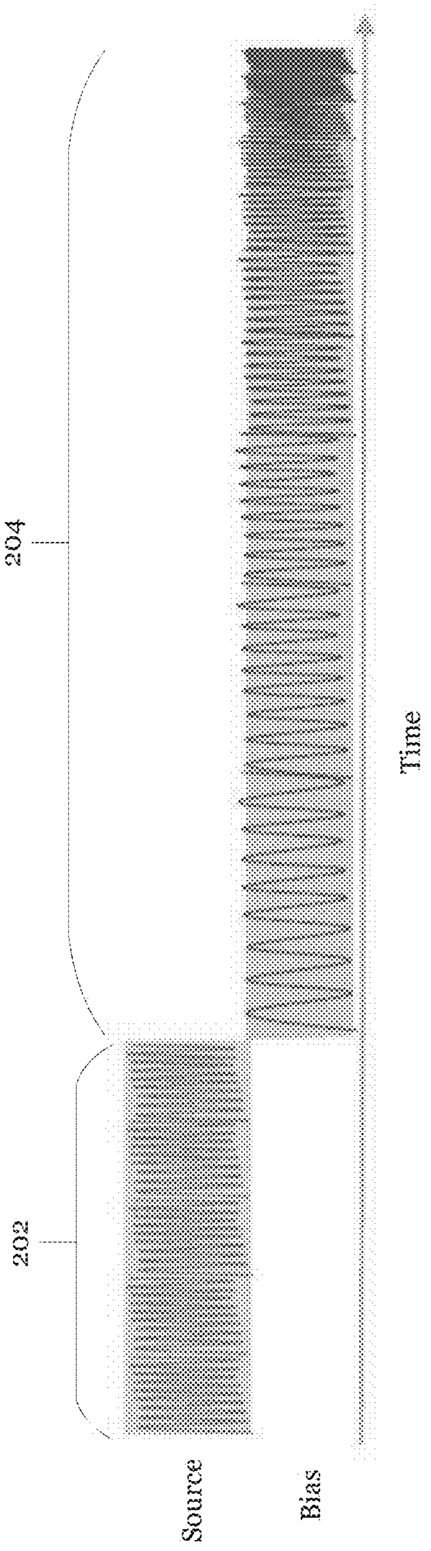
FIG. 4 illustrates a source power pulse and a bias power pulse plotted versus time during a plasma process, in accordance with some embodiments.

FIG. 4 illustrates a source power pulse and a bias power pulse plotted versus time during a plasma process, in accordance with some embodiments. During the source phase 202, the source power pulse is active and the bias power is inactive. Next, during the bias phase 204, the bias power pulse is active and the source power is inactive. The RF frequency of the bias power pulse is increased over the bias phase 204 from a lower value (e.g., 400 kHz) to a higher value (e.g., 60 MHz), as described above with respect to FIGS. 3B-3E. In some embodiments the bias frequency is monotonically increased from a lower value to a higher value. This may keep a peak energy of an ion energy distribution at a same level, which may be useful for process control such as etch selectivity or an ion-assisted formation of a passivation layer.

Figure 5B:
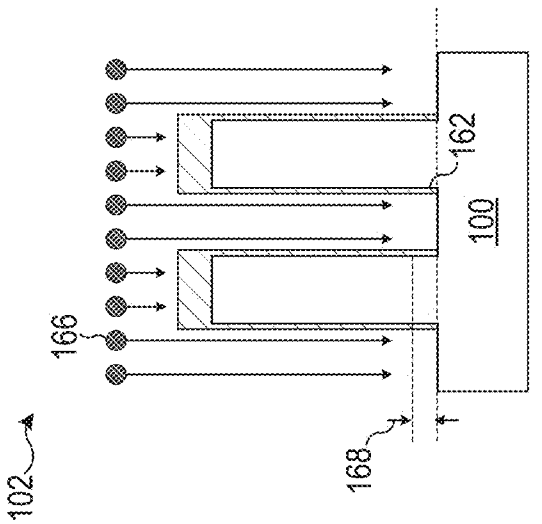
FIGS. 5A and 5B illustrate an example plasma processing method with a deposition phase and an etching phase, in accordance with some embodiments.
Figure 5A:
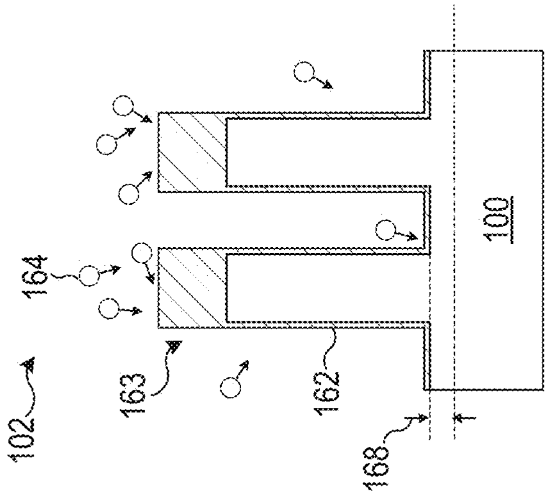

FIGS. 5A and 5B illustrate an example plasma processing method with a deposition phase and an etching phase, in accordance with some embodiments. The plasma processing method may be performed in a suitable plasma processing system, such as the example plasma processing system 10 described above with respect to FIG. 1.

As illustrated by FIG. 5A, the first phase is a deposition phase and is characterized by the generation of low-energy ions 164 at a workpiece 102. The workpiece 102 includes a substrate 100. The substrate 100 may be any suitable substrate for which plasma processing is desired. Low-energy ions are produced by a plasma process including repeating source power pulses and bias power pulses in which the frequencies of the bias power pulses are increased during each bias power pulse, as described above with respect to FIGS. 3B-3E and 4. The low-energy ions 164 may facilitate the deposition of a passivating layer 162. The passivating layer 162 may be advantageously selectively deposited at top surfaces 163 of features of the substrate 100. For example, the low-energy ions 164 may be substantially thermal resulting in reduced penetration into narrow features of the substrate 100. This may result in the desired selective behavior. In some embodiments, the features of the substrate 100 are fins or sheets and the plasma processing method is a gate etch (such as a soft-landing step for gate etching in some embodiments).

Next, FIG. 5B illustrates an etching phase that includes high-energy ions 166, which may be produced with an ion energy distribution having a higher peak energy than the peak energy of the ion energy distribution of the deposition phase. The high-energy ions 166 may have considerable vertical velocity compared to the near-thermal low-energy ions 164 of the deposition phase (see above, FIG. 5A). This verticality of the high-energy ions 166 may result in etching of the substrate to an etch depth 168. Because the high-energy ions 166 are substantially vertical, they reach the bottom of the features with minimal undesirably interaction with sidewalls. However, the top surfaces 163 of the features are exposed to the high-energy ions 166. The selective deposition of the passivating layer 162 may advantageously protect the top surfaces 163 of features from undesirable effects such as recess.

FIGS. 6A, 6B, 6C, and 6D illustrate source/bias pulse schemes for single pulse periods of plasma processing methods including a ramping up of the bias pulse frequency, in accordance with some embodiments. The source power pulses operate at relatively high frequency (HF) for a period $$T_{on}^{HF}$$

while the bias power pulses are off and the bias power pulses operate at relatively low frequency (LF) for a period $$T_{on}^{LF}$$

while the source power pulses are off. In various embodiments, any suitable duty ratio may be used for the source power pulses and the bias power pulses, so long as the source power pulses and bias power pulses do not overlap. In other words, the source power pulses and bias power pulses should be supplied asynchronously. In other embodiments, the source power pulses and bias power pulses may overlap in time if the source power is significantly low but nonzero during the afterglow phase. In other words, the source power pulse is turned down but not entirely turned off when the bias power pulse starts. This may produce a similar effect as asynchronous source and bias power pulsing.

Figure 6A:
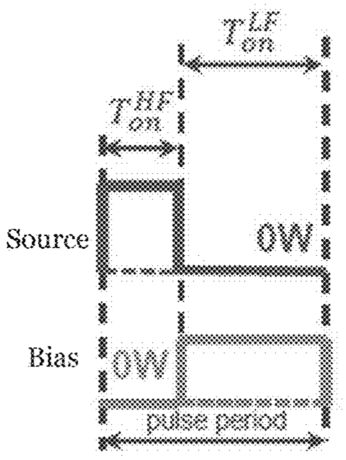
FIGS. 6A, 6B, 6C, and 6D illustrate source/bias pulse schemes for single pulse periods of plasma processing methods, in accordance with some embodiments.

In the scheme illustrated by FIG. 6A, the source power pulse is on for a period $$T_{on}^{HF}$$

and is immediately followed by the bias power pulse, which is on for a period $$T_{on}^{LF}.$$

In some embodiments, the period $$T_{on}^{LF}$$

is longer than the period $$T_{on}^{HF}.$$

Figure 6B:
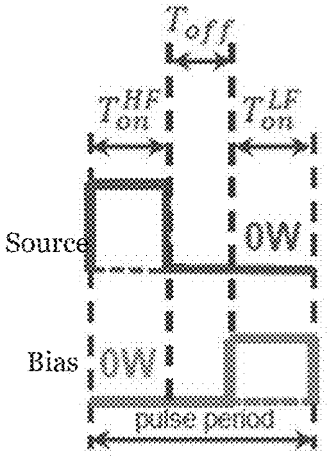

In the scheme illustrated by FIG. 6B, the source power pulse is on for a period $$T_{on}^{HF}$$

and is followed by a period $T_{off}$ (also referred to as a time interval) in which both the source power and the bias power are off. Next, the bias power pulse is on for a period $$T_{on}^{LF}.$$

In some embodiments, the periods $$T_{on}^{HF},$$

$$T_{on}^{LF},$$

and $T_{off}$ are about the same length.

Figure 6C:
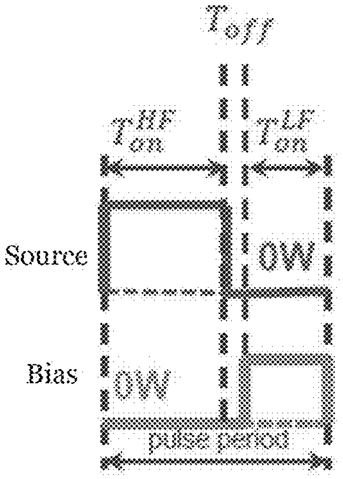

In the scheme illustrated by FIG. 6C, the source power pulse is on for a period $$T_{on}^{HF}$$

and is followed by a period $T_{off}$ in which both the source power and the bias power are off. Next, the bias power pulse is on for a period $$T_{on}^{LF}.$$

In some embodiments, the period $$T_{on}^{HF}$$

is longer than the period $$T_{on}^{LF},$$

and the period $$T_{on}^{LF}$$

is longer than the period $T_{off}$.

Figure 6D:
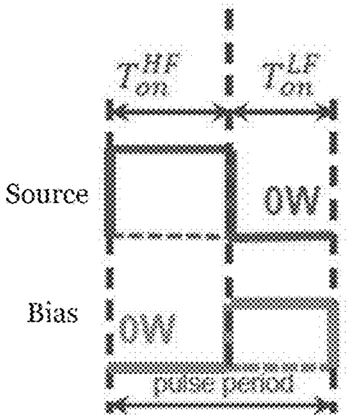

In the scheme illustrated by FIG. 6D, the source power pulse is on for a period $$T_{on}^{HF}$$

and is immediately followed by the bias power pulse, which is on for a period $$T_{on}^{LF}.$$

In some embodiments, the period $$T_{on}^{HF}$$

is longer than the period $$T_{on}^{LF}.$$

In other embodiments, the periods $$T_{on}^{HF}$$

and $$T_{on}^{LF}$$

are about the same length.

Figure 7:
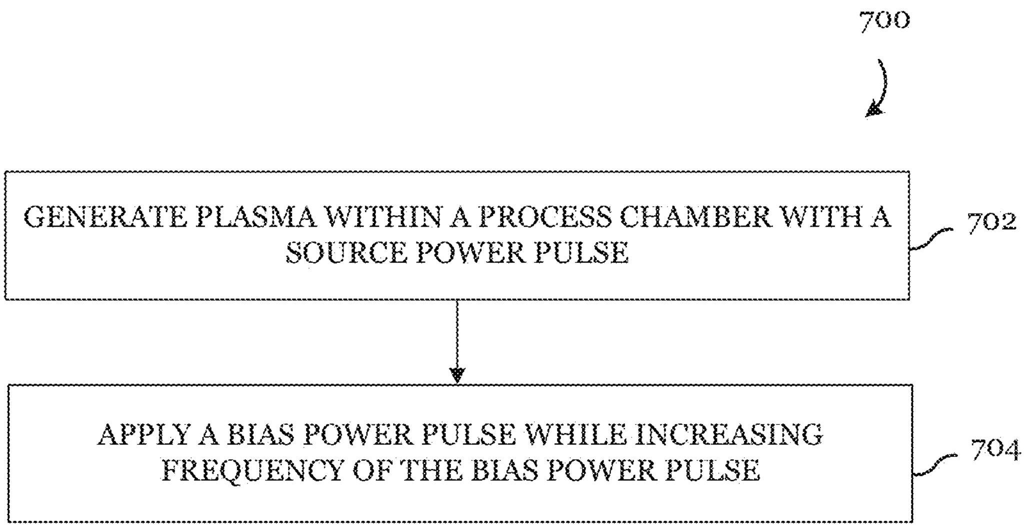
FIG. 7 illustrates a process flow chart diagram of a method for a plasma process, in accordance with some embodiments.

FIG. 7 illustrates a process flow chart diagram of a method 700 for a plasma process, in accordance with some embodiments. In step 702, a plasma is generated within a process chamber with a source power (SP) pulse as described above with respect to FIGS. 1-2. In step 704, a bias power (BP) pulse is applied to a substrate holder within the process chamber, as described above with respect to FIGS. 3B-3E and 4. A frequency of the BP pulse increases from a first frequency value to a second frequency value during the BP pulse. The BP pulse occurs after the SP pulse.

Figure 8:
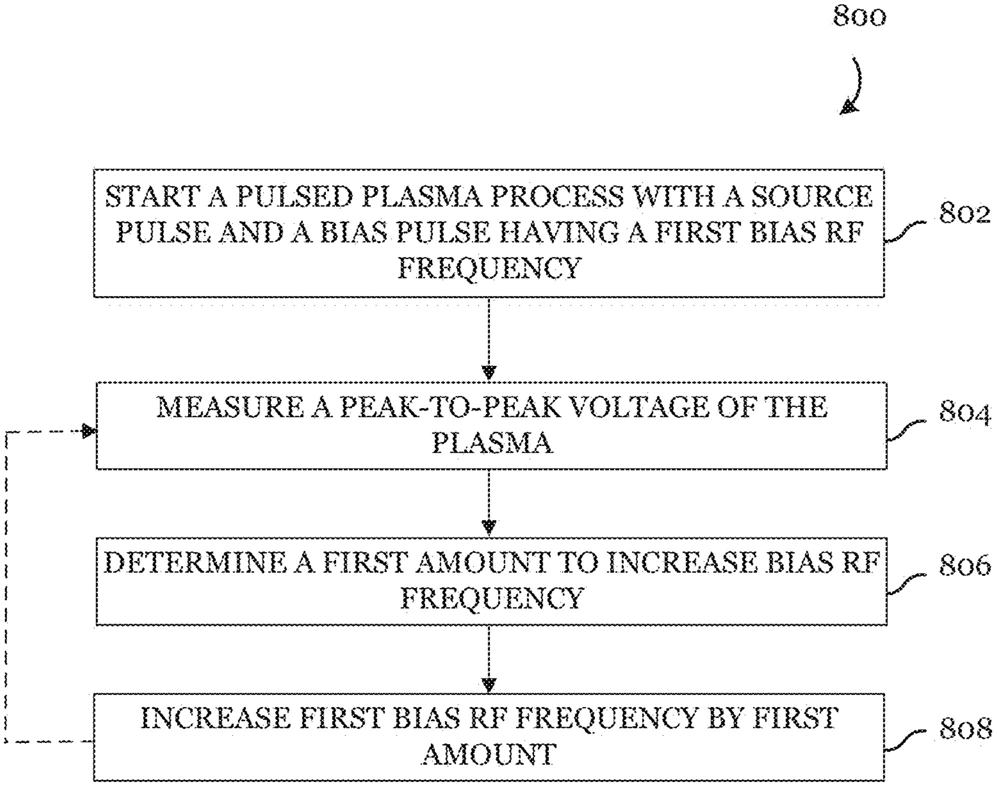
FIG. 8 illustrates a process flow chart diagram of a method for a plasma process, in accordance with some embodiments.

FIG. 8 illustrates a process flow chart diagram of a method 800 for a plasma process, in accordance with some embodiments. In step 802, a pulsed plasma process is started with a source power pulse and a bias power pulse, the bias power pulse having a first bias RF frequency, as described above with respect to FIGS. 2 and 3A. The pulsed plasma process generates a plasma.

In step 804, a peak-to-peak voltage of the plasma is measured, as described above with respect to FIGS. 3B-3E. In step 806, based on the peak-to-peak voltage, a first amount to increase bias RF frequency in order to maintain an ion energy peak at a same level is determined, as described above with respect to FIGS. 3B-3E. In step 808, the first bias RF frequency is increased by the first amount to a second bias RF frequency, as described above with respect to FIGS. 3B-3E. In some embodiments, steps 804 through 808 are repeated for any suitable number of cycles, as described above with respect to FIGS. 3C-3E.

Figure 9:
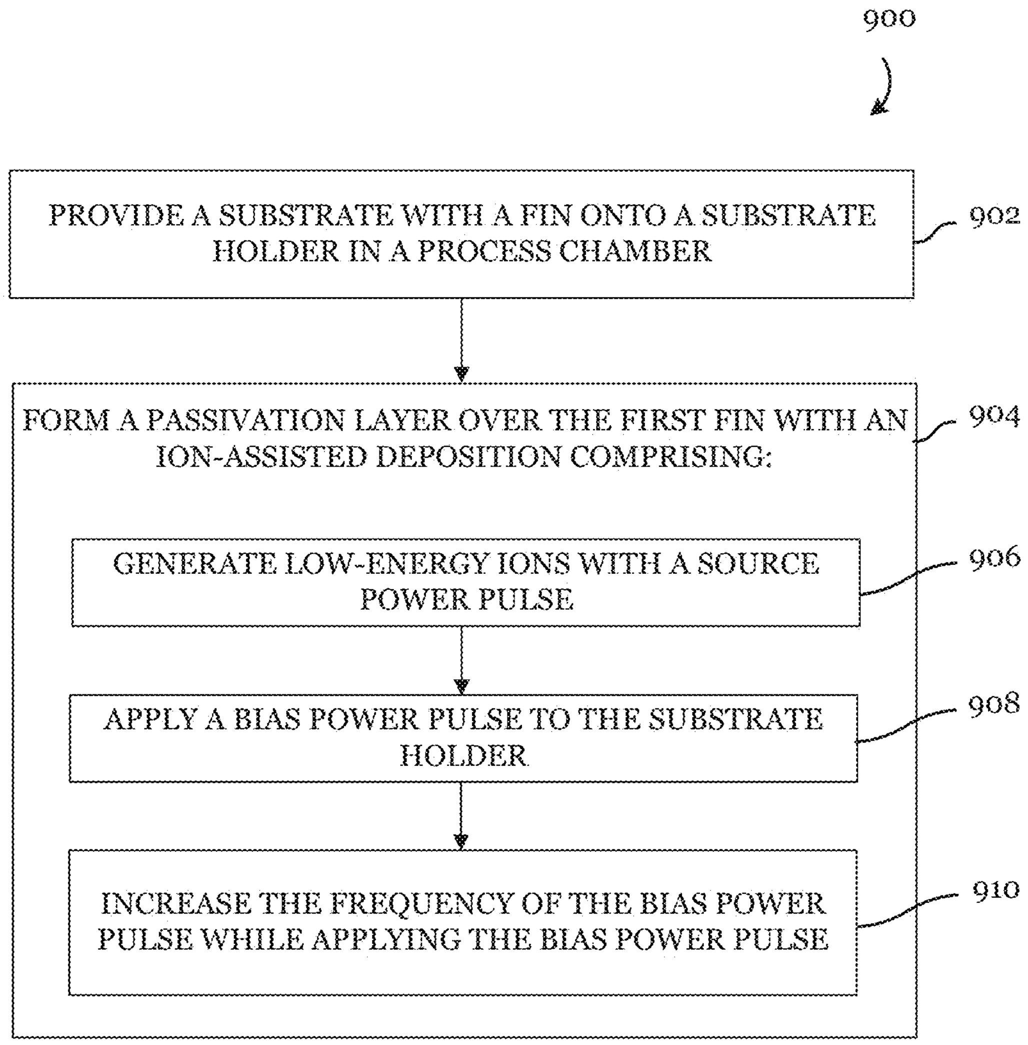
FIG. 9 illustrates a process flow chart diagram of a method for processing a substrate, in accordance with some embodiments.

FIG. 9 illustrates a process flow chart diagram of a method 900 for processing a substrate, in accordance with some embodiments. In step 902, a substrate onto a substrate holder in a process chamber, as described above with respect to FIG. 1. A first fin extends from the substrate, as described above with respect to FIG. 5A. In step 904, a passivation layer is formed over the first fin with an ion-assisted deposition, as described above with respect to FIG. 5A.

In step 906 of the ion-assisted deposition, low-energy ions are generated at the first fin by generating plasma in the process chamber with a source power (SP) pulse, as described above with respect to FIG. 5A. In step 908 of the ion-assisted deposition, a bias power (BP) pulse to the substrate holder with a frequency of the BP pulse being at a first frequency value, as described above with respect to FIGS. 3B-3E. In step 910 of the ion-assisted deposition, while applying the BP pulse, the frequency of the BP pulse is increased to a second frequency value, as described above with respect to FIGS. 3B-3E.

Example embodiments of the disclosure are summarized here. Other embodiments can also be understood from the entirety of the specification as well as the claims filed herein.

Example 1. A method for a plasma process, the method including: generating plasma within a process chamber with a source power (SP) pulse; and applying a bias power (BP) pulse to a substrate holder within the process chamber, a frequency of the BP pulse increasing from a first frequency value to a second frequency value during the BP pulse, the BP pulse occurring after the SP pulse.

Example 2. The method of example 1, further including maintaining an ion energy peak at a first value by increasing the frequency of the BP pulse.

Example 3. The method of example 2, where the increasing the frequency of the BP pulse is determined by measuring a peak-to-peak voltage of an ion energy distribution of the plasma.

Example 4. The method of one of examples 1 to 3, where the BP pulse immediately follows the SP pulse.

Example 5. The method of one of examples 1 to 3, where the BP pulse is separated from the SP pulse by a time interval.

Example 6. The method of one of examples 1 to 5, where the SP pulse is longer than the BP pulse.

Example 7. The method of one of examples 1 to 5, where the BP pulse is longer than the SP pulse.

Example 8. The method of one of examples 1 to 7, where an operating frequency range for the BP pulse is 100 kHz to 10 GHz.

Example 9. The method of one of examples 1 to 8, where an operating frequency range for the SP pulse is 1 Hz to 1 MHz.

Example 10. A method for a plasma process, the method including: starting a pulsed plasma process with a source power pulse and a bias power pulse, the bias power pulse having a first bias RF frequency, the pulsed plasma process generating a plasma; measuring a peak-to-peak voltage of the plasma; based on the peak-to-peak voltage, determining a first amount to increase bias RF frequency in order to maintain an ion energy peak at a same level; and increasing the first bias RF frequency by the first amount to a second bias RF frequency.

Example 11. The method of example 10, further including: based on the peak-to-peak voltage, determining a second amount to increase bias RF frequency in order to maintain the ion energy peak at the same level; and increasing the second bias RF frequency by the second amount to a third bias RF frequency.

Example 12. The method of one of examples 10 or 11, where the pulsed plasma process generates the plasma from a precursor gas including argon, nitrogen, hydrogen, or hydrogen bromide.

Example 13. The method of one of examples 10 or 11, where the pulsed plasma process generates the plasma from a precursor gas including oxygen or tetrafluoromethane.

Example 14. The method of one of examples 10 or 11, where the pulsed plasma process generates the plasma from a precursor gas including hexafluorobutadiene or octafluorocyclobutane.

Example 15. The method of one of examples 10 to 14, where the pulsed plasma process generates the plasma with a total flow rate of precursors in a range of 1 sccm to 5000 sccm.

Example 16. The method of one of examples 10 to 15, where the pulsed plasma process is performed at a pressure in a range of 0.1 mTorr to 1 Torr.

Example 17. The method of one of examples 10 to 16, where the pulsed plasma process is performed at a temperature in a range of −200° C. to 500° C.

Example 18. A method for processing a substrate, the method including: providing a substrate onto a substrate holder in a process chamber, a first fin extending from the substrate; and forming a passivation layer over the first fin with an ion-assisted deposition, the ion-assisted deposition including: generating low-energy ions at the first fin by generating plasma in the process chamber with a source power (SP) pulse; applying a bias power (BP) pulse to the substrate holder, a frequency of the BP pulse being at a first frequency value; and while applying the BP pulse, increasing the frequency of the BP pulse to a second frequency value.

Example 19. The method of example 18, further including etching the substrate with high-energy ions after forming the passivation layer.

Example 20. The method of one of examples 18 or 19, where the BP pulse is applied to the substrate holder after the SP pulse ends.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for a plasma process, the method comprising:
- generating plasma within a process chamber with a source power (SP) pulse; and
- applying a bias power (BP) pulse to a substrate holder within the process chamber, a frequency of the BP pulse increasing from a first frequency value to a second frequency value during the BP pulse, the BP pulse occurring after the SP pulse.

2. The method of claim 1, further comprising maintaining an ion energy peak at a first value by increasing the frequency of the BP pulse.

3. The method of claim 2, wherein the increasing the frequency of the BP pulse is determined by measuring a peak-to-peak voltage of an ion energy distribution of the plasma.

4. The method of claim 1, wherein the BP pulse immediately follows the SP pulse.

5. The method of claim 1, wherein the BP pulse is separated from the SP pulse by a time interval.

6. The method of claim 1, wherein the SP pulse is longer than the BP pulse.

7. The method of claim 1, wherein the BP pulse is longer than the SP pulse.

8. The method of claim 1, wherein an operating frequency range for the BP pulse is 100 kHz to 10 GHz.

9. The method of claim 1, wherein an operating frequency range for the SP pulse is 1 Hz to 1 MHz.

10. The method of claim 1, further comprising forming a passivation layer over a substrate while generating the plasma and applying the BP pulse.

11. A method for a plasma process, the method comprising:

starting a pulsed plasma process with a source power pulse and a bias power pulse, the bias power pulse having a first bias RF frequency, the pulsed plasma process generating a plasma;

measuring a peak-to-peak voltage of the plasma;

based on the peak-to-peak voltage, determining a first amount to increase bias RF frequency in order to maintain an ion energy peak at a same level; and increasing the first bias RF frequency by the first amount to a second bias RF frequency.

12. The method of claim 11, further comprising: based on the peak-to-peak voltage, determining a second amount to increase bias RF frequency in order to maintain the ion energy peak at the same level; and increasing the second bias RF frequency by the second amount to a third bias RF frequency.

13. The method of claim 11, wherein the pulsed plasma process generates the plasma from a precursor gas comprising argon, nitrogen, hydrogen, or hydrogen bromide.

14. The method of claim 11, wherein the pulsed plasma process generates the plasma from a precursor gas comprising oxygen or tetrafluoromethane.

15. The method of claim 11, wherein the pulsed plasma process generates the plasma from a precursor gas comprising hexafluorobutadiene or octafluorocyclobutane.

16. The method of claim 11, wherein the pulsed plasma process generates the plasma with a total flow rate of precursors in a range of 1 sccm to 5000 sccm.

17. The method of claim 11, wherein the pulsed plasma process is performed at a pressure in a range of 0.1 mTorr to 1 Torr.

18. The method of claim 11, wherein the pulsed plasma process is performed at a temperature in a range of −200° C. to 500° C.

19. The method of claim 11, further comprising forming a passivation layer over a fin extending from a substrate with the pulsed plasma process.

20. A method for processing a substrate, the method comprising:

providing a substrate onto a substrate holder in a process chamber, a first fin extending from the substrate; and forming a passivation layer over the first fin with an ion-assisted deposition, the ion-assisted deposition comprising:

generating low-energy ions at the first fin by generating plasma in the process chamber with a source power (SP) pulse;

applying a bias power (BP) pulse to the substrate holder, a frequency of the BP pulse being at a first frequency value; and while applying the BP pulse, increasing the frequency of the BP pulse to a second frequency value.

21. The method of claim 20, further comprising etching the substrate with high-energy ions after forming the passivation layer.

22. The method of claim 20, wherein the BP pulse is applied to the substrate holder after the SP pulse ends.

23. The method of claim 20, wherein increasing the frequency of the BP pulse to a second frequency value comprises:

measuring a peak-to-peak voltage of the plasma; and based on the peak-to-peak voltage, determining an amount to increase the frequency of the BP pulse in order to maintain an energy peak of the low-energy ions at a same level.

* * * * *